United States Patent
Hironaka et al.

(12)

(10) Patent No.: US 6,618,228 B1
(45) Date of Patent: Sep. 9, 2003

(54) CURRENT DETECTING APPARATUS AND ELECTRIC MOTOR CONTROL APPARATUS

(75) Inventors: Shinzi Hironaka, Saitama (JP); Osamu Tsurumiya, Saitama (JP); Akio Kobayashi, Saitama (JP); Yoshiki Noro, Saitama (JP); Yoshinobu Mukai, Saitama (JP); Susumu Ohta, Saitama (JP); Takao Kurosawa, Saitama (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/440,716

(22) Filed: Nov. 16, 1999

(30) Foreign Application Priority Data

Jan. 12, 1999 (JP) ............................. 11-005111

(51) Int. Cl.[7] .............................................. F21V 7/04
(52) U.S. Cl. ...................................................... 361/31
(58) Field of Search ...................... 361/23, 31; 318/647; 324/207.2

(56) References Cited

U.S. PATENT DOCUMENTS

| | | | | |
|---|---|---|---|---|
| 4,751,978 A | * | 6/1988 | Drutchas et al. | 180/142 |
| 4,896,735 A | * | 1/1990 | Morishita et al. | 180/79.1 |
| 5,343,145 A | * | 8/1994 | Wellman et al. | 324/202 |
| 5,404,960 A | * | 4/1995 | Wada et al. | 180/79.1 |
| 5,552,700 A | * | 9/1996 | Kazuhide et al. | 324/117 |
| 5,912,539 A | * | 6/1999 | Sugitani et al. | 318/434 |

FOREIGN PATENT DOCUMENTS

| | | | | |
|---|---|---|---|---|
| JP | 6-289059 | | 10/1994 | ............ G01R/15/02 |
| JP | 8-34359 | | 2/1996 | ............ B62D/6/00 |
| JP | 180480 A | * | 6/2000 | ............ G01R/21/08 |

* cited by examiner

*Primary Examiner*—Gregory J. Toatley, Jr.
*Assistant Examiner*—Z Kitov
(74) *Attorney, Agent, or Firm*—Sughrue Mion, PLLC (57) ABSTRACT

A current detecting apparatus comprises a determining unit which determines whether the electric potential of a first node or a second node is in a predetermined range. When the condition that the electric potential is not in the predetermined range continues longer than the predetermined period of time, the determining signal indicating the damage occurrence is outputted. Accordingly, the damage of the constituting elements can exactly be determined with the relatively simple configuration in a short time.

11 Claims, 7 Drawing Sheets

CURRENT DETECTING APPARATUS AND ELECTRIC MOTOR CONTROL APPARATUS

FIELD OF THE INVENTION

The present invention relates to a current detecting apparatus which is provided in, for example, an electric power steering apparatus of an automobile and which generates a detecting signal having electric potential proportional to magnetic flux density of a magnetic field arising from a current to be detected, and an electric motor control apparatus comprising the current detecting apparatus.

BACKGROUND OF THE INVENTION

Figure 1:
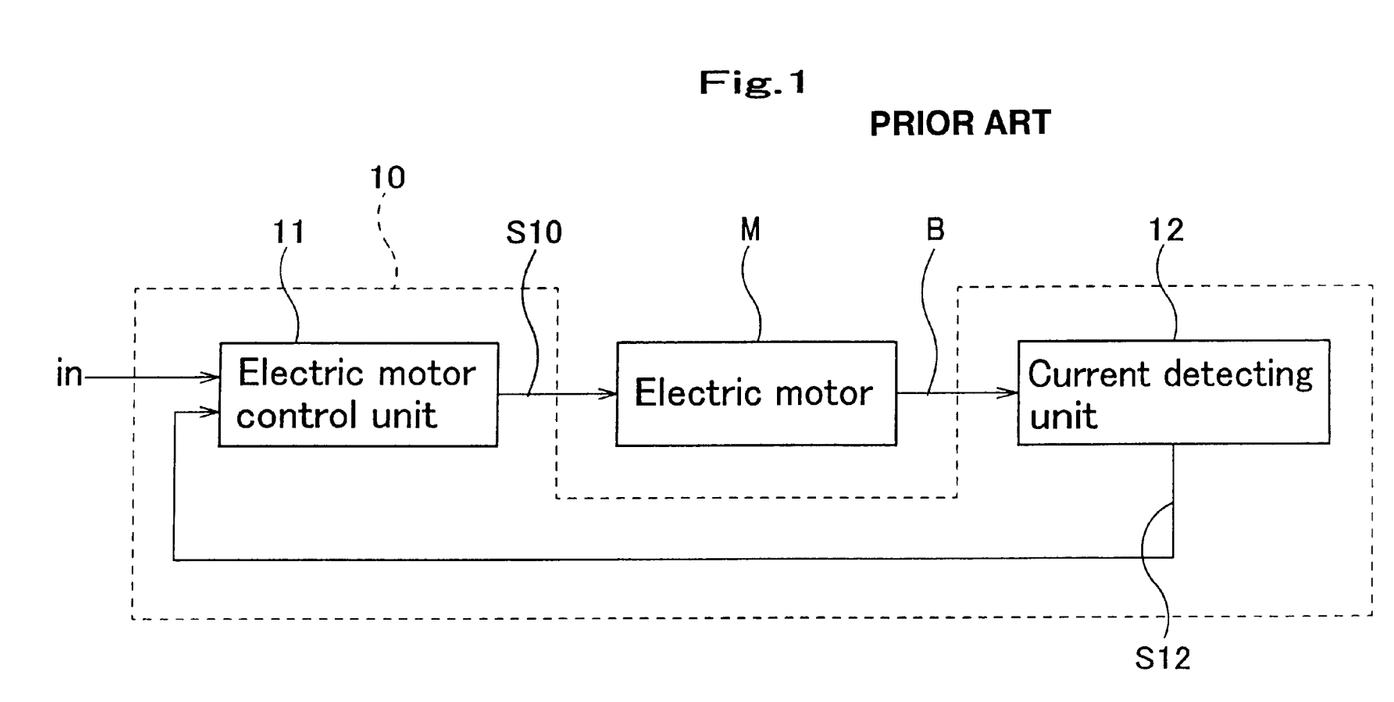
FIG. 1 is a block diagram showing the conventional electric motor control apparatus.

FIG. 1 is a block diagram showing one embodiment of an electric motor control apparatus comprising the conventional current detecting apparatus.

Reference numeral 10 is an electric motor control apparatus 10 which comprises an electric motor control unit 11. The electric motor control unit 11 inputs an input signal IN which is a command of a driving signal for driving an electric motor M and compares the absolute value of the electric potential of the input signal IN with the absolute value of the electric potential of a comparing signal S12. Then, it generates either a driving signal S10 for decreasing torque corresponding to the positive potential difference between the input signal IN and the comparing signal S12 or a driving signal S10 for increasing torque corresponding to the negative electric potential difference between the input signal IN and the comparing signal S12.

The electric motor M rotating by the driving signal S10 is connected to the output of the electric motor control unit 11. Further, the electric motor control apparatus 10 is provided with a current detecting apparatus (for example, a current detecting unit) 12. The current detecting unit 12 is a circuit to generate the comparing signal S12 proportional to magnetic flux density of a magnetic field B arising from the current flowing to the electric motor M driven by the driving signal S10. The current detecting unit 12 has the electric motor control unit 11 connected at the output thereof.

Figure 2:
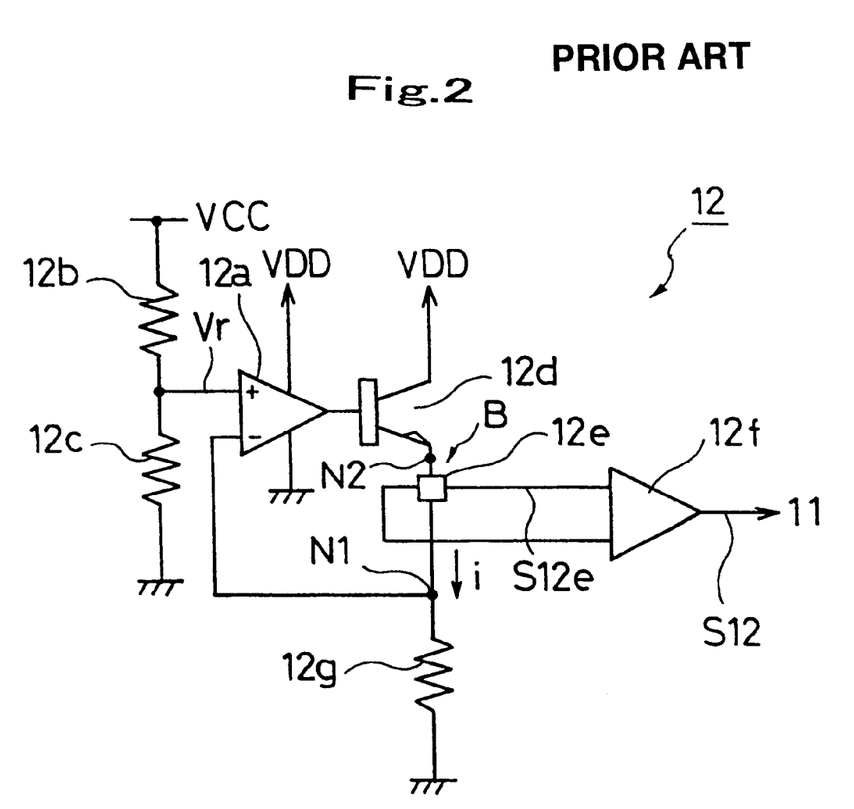
FIG. 2 is a circuit diagram of the current detecting unit 12 of FIG. 1.

FIG. 2 is a circuit diagram showing one embodiment of the current detecting unit 12 of FIG. 1.

The current detecting unit 12 comprises an operational amplifier (herein under called op-amp) 12a. A noninverting input terminal of the op-amp 12a is connected to a power supply electric potential VCC through a resistor 12b and grounded through a resister 12c. An inverting input terminal of the op-amp 12a is connected to a node Ni. A positive power supply terminal of the op-amp 12a is connected to a power supply electric potential VDD and a negative power supply terminal of the op-amp 12a is grounded. A transistor 12d is connected to an output terminal of the op-amp 12a at a base thereof and connected to a node N2 at an emitter thereof. There is an input terminal of a hall sensor 12e connected between the node Ni and the node N2. The magnetic field B arising from the current which is a subject to be detected and which starts flowing to the electric motor M by the driving signal S10 is applied to the hall sensor 12e. The hall sensor 12e outputs an output signal S12e having the electric potential proportional to the magnetic flux density of the magnetic field B and a control current i supplied from the node N2. The output terminal of the hall sensor 12e is connected to an op-amp 12f for amplifying the output signal S12e by the predetermined gain and supplying the comparing signal S12. The node Ni is grounded through a resistor 12g.

Figure 3:
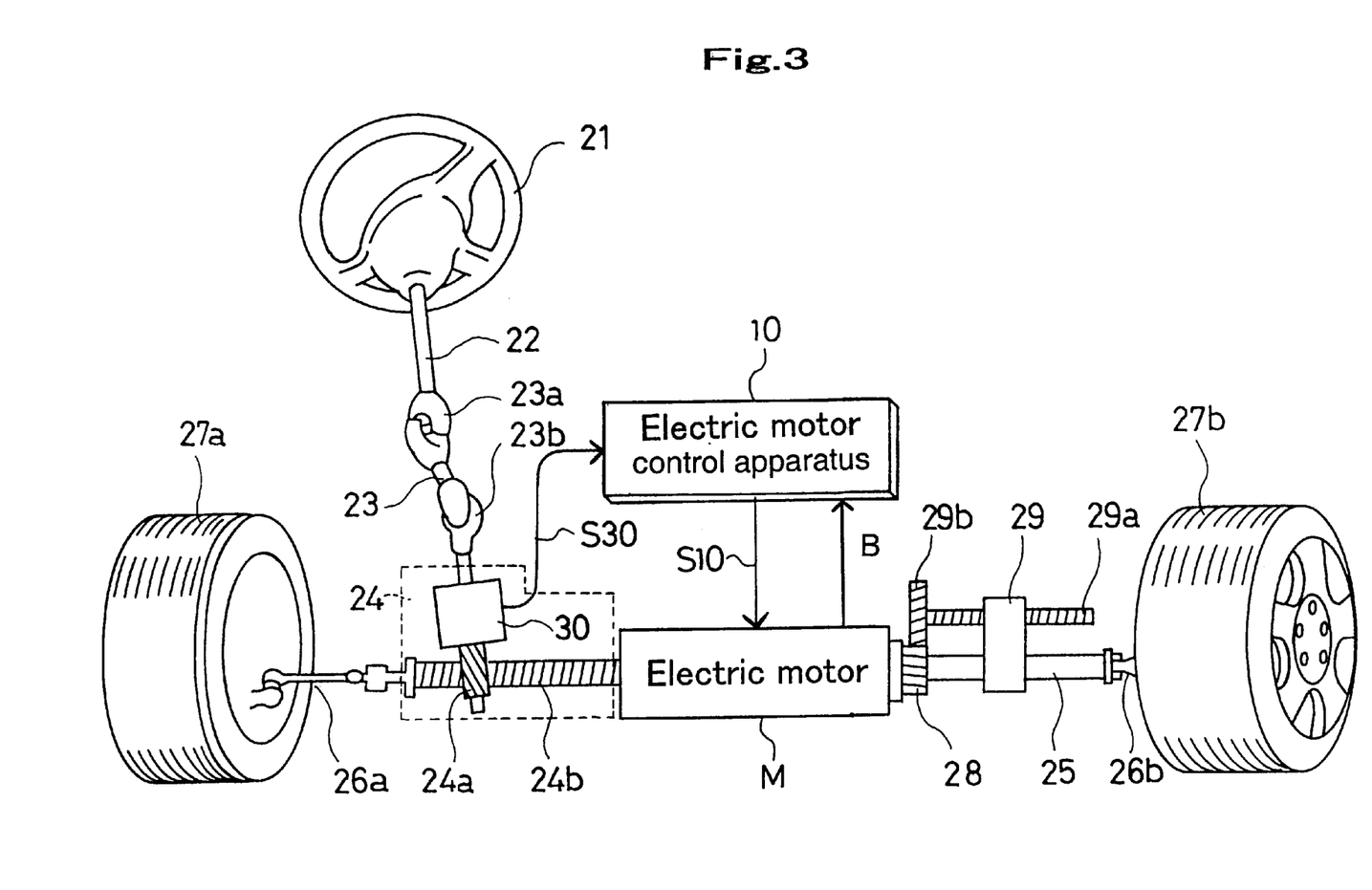
FIG. 3 is a schematic view showing the configuration of an electric power steering apparatus.

FIG. 3 is a schematic view showing one embodiment of an electric motor power steering apparatus used in an automobile utilizing the electric motor control apparatus 10 shown in FIG. 1

The electric motor power steering apparatus comprises a handle 21. The handle 21 is connected with a steering shaft 22. The steering shaft 22 is connected to a pinion 24a inside a steering gear box 24 with a coupler shaft 23 having free joints 23a, 23b at both ends. The handle 21, the steering shaft 22, the coupler shaft 23 and the steering gear box 24 constitute a hand-operated steering power generating means. The steering gear box 24 contains a rack 24b meshing into the pinion 24a. The steering power due to the handle 21 is converted into the axial direction by meshing the pinion 24a into the rack 24b to reciprocate a rack shaft 25 united with the rack 24b. The rack shaft 25 is connected to front wheels 27a, 27b at both ends thereof with tie rods 26a, 26b.

The electric motor power steering apparatus comprises an electric motor M which is arranged in the same shaft as the rack shaft 25 and which is for applying assist torque to amplify the steering power of the hand-operated steering generation means to decrease the steering power of a driver. The electric motor M has a rotor integrated with a helical gear 28 at the driving side. The helical gear 28 meshes into a helical gear 29b integrated with one end of a screw shaft 29a of a ball screw mechanism 29. Further, The steering gear box 24 contains a steering torque detecting means 30 for detecting hand-operated steering torque of a driver acting on the pinion 24a. The electric motor control apparatus 10 of FIG. 1 is connected to the output of the steering torque detecting means 30, and the electric motor M is connected to the electric motor control apparatus 10.

In the electric power steering apparatus, the hand-operated steering torque generates as the driver operates the handle 21, and the front wheels 27a, 27b are moved to change the driving direction of the automobile. At this point, the steering torque detecting means 30 detects the hand-operated steering torque and outputs a detecting signal S30. The detecting signal S30 is applied to the electric motor control unit 11 of FIG. 1 as an input signal IN. The electric motor control unit 11 outputs the driving signal S10 corresponding to the input signal IN. The electric motor M rotates by the driving signal S10, and then the rotating torque is converted into the thrust through the helical gear 28 and the ball screw mechanism 29 to assist the thrust of the rack shaft 25. The magnetic field B arising from the current which starts flowing into the electric motor M by the driving signal S10 is applied to a hall sensor 12e of the current detecting unit 12.

In the current detecting unit 12, the electric potential of the node N2 is controlled so that the electric potential of the node Ni is equal to the reference electric potential Vr set by the resistors 12b, 12c. Further, the control current i is supplied to the node N2 from the power supply electric potential VDD. The value of the control current i is set by the resistor 12g. The control current i is applied to the hall sensor 12e, and the hall sensor 12e outputs an output signal S12e having the electric potential proportional to the control current i and the magnetic flux density of the magnetic field B. The output signal S12e is applied to the op-amp 12f and amplified, and the op-amp 12f outputs the comparing signal S12. The input signal IN is compared with the comparing signal S12 by the electric motor control unit 11. Then, if the comparing signal S12 is larger than the input signal IN, the electric motor control unit 11 outputs the driving signal S10 for decreasing torque. On the other hand, if the comparing signal S12 is smaller than the input signal IN, the electric motor control unit 11 outputs the driving signal S10 for increasing torque.

SUMMARY OF THE INVENTION

The conventional electric motor control apparatus 10 of FIG. 1 has the following problems.

Figure 4:
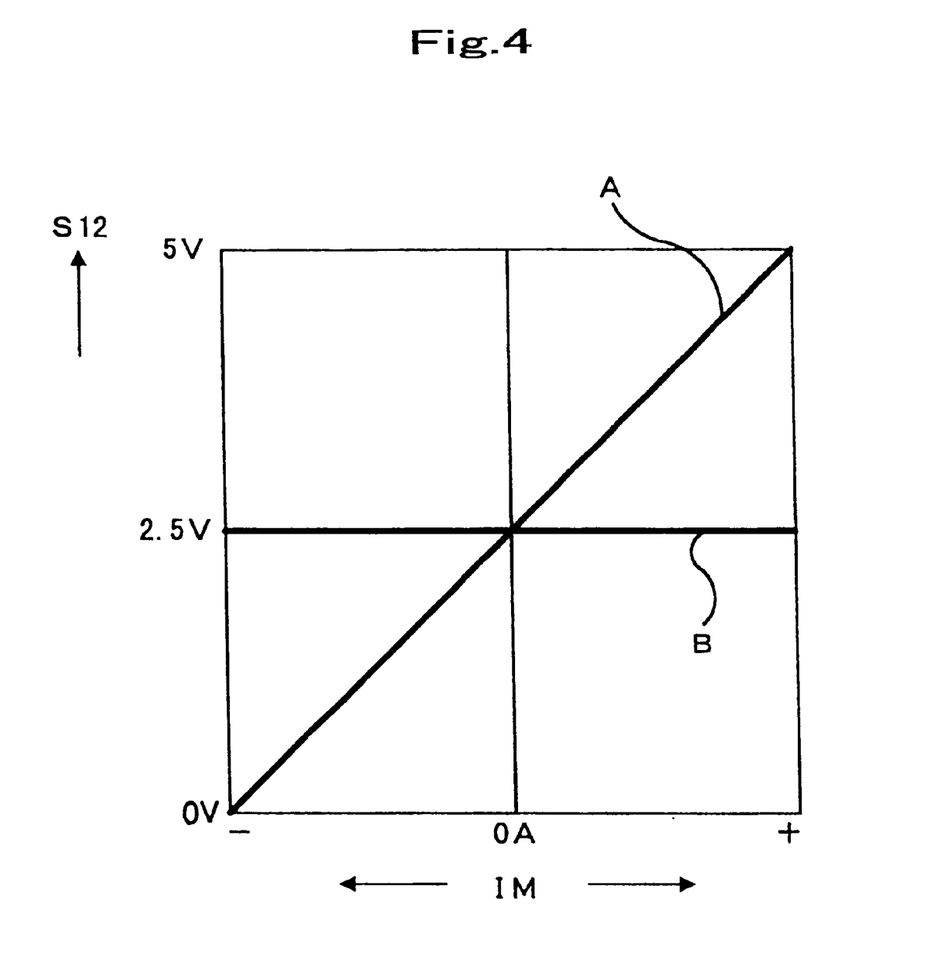
FIG. 4 is a graph showing the relationship between the current IM and the comparing signal S12.

FIG. 4 is a graph showing the relationship between the current IM flowing to the electric motor M and the comparing signal S12. The vertical axis indicates the electric potential of the comparing signal S12 and the horizontal axis indicates the current IM.

In FIG. 4, the assist torque is applied to the right direction with respect to the driving direction of the automobile in the positive region of the current IM and the assist torque is applied to the left direction with respect to the driving direction of the automobile in the negative region of the current IM. The characteristic line A shows the relationship between the normal current IM and the comparing signal S12. It is found that the current IM is proportional to the comparing signal S12. The characteristic line B shows the relationship between the current IM and the comparing signal S12 in a case that the control current i does not flow because of the occurrence of the damage in the current detecting unit 12. In this case, the comparing signal S12 becomes 2.5 V at all the time. However, although the current detecting unit 12 operates normally, if the current IM is zero ampere, the comparing signal S12 is 2.5V. Because of this reason, the damage of the current detecting unit 12 cannot be detected based on the value of the comparing signal S12.

To solve the problem, the damage detecting apparatus may be constituted with a computer to detect the damage of the current detecting unit 12 by analyzing the relationship between the current IM and the comparing signal S12. However, if the computer is used, the circuits are complicated and becomes large, which is unrealizable.

It is an object of the present invention to provide a current detecting apparatus having a function to determine the damage with the simple configuration and an electric motor control apparatus comprising the current detecting apparatus.

A current detecting apparatus of the present invention which comprises a hall element for outputting the change of a current to be detected as a voltage and a constant-current regulated power supply for supplying a constant current to the hall sensor comprises means for monitoring the constant current, whereby the damage of the current detecting apparatus can be detected.

The monitoring means can be an output terminal for supplying a voltage which varies according to the change of the constant current. Further, the monitoring means can be an output terminal for supplying a current from which the change of the constant current can be known. Furthermore, the current detecting apparatus may further comprises means for determining the damage of the current detecting apparatus from the change of the constant current monitored by the monitoring means.

According to the current detecting apparatus of the present invention, the damage of the constituting elements of the constant-current regulated power supply can exactly be determined with the relatively simple configuration in a short time.

An electric motor control apparatus of the present invention comprises an electric motor control unit for controlling power of a motor, and a current detecting apparatus comprising a hall element for outputting the change of a current flowing to the motor as a voltage and a constant-current regulated power supply for supplying a constant current to the hall sensor and means for monitoring the constant current, whereby the damage of the current detecting apparatus can be detected.

The monitoring means can be an output terminal for supplying a voltage which varies according to the change of the constant current. Further, the monitoring means can be an output terminal for supplying a current from which the change of the constant current can be known. Furthermore, the current detecting apparatus may further comprises means for determining the damage of the current detecting apparatus from the change of the constant current monitored by the monitoring means.

According to the electric motor control apparatus of the present invention, the damage of the constituting elements of the constant-current regulated power supply can exactly be determined with the relatively simple configuration in a short time.

DESCRIPTION OF THE PREFERRED EMBODIMENTS

The preferred embodiments of the present invention will be described hereinafter with reference to the accompanying drawings. In the following description and the drawings, the same reference numerals are used for the same components and repetitive description on the same components will be omitted.

Figure 5:
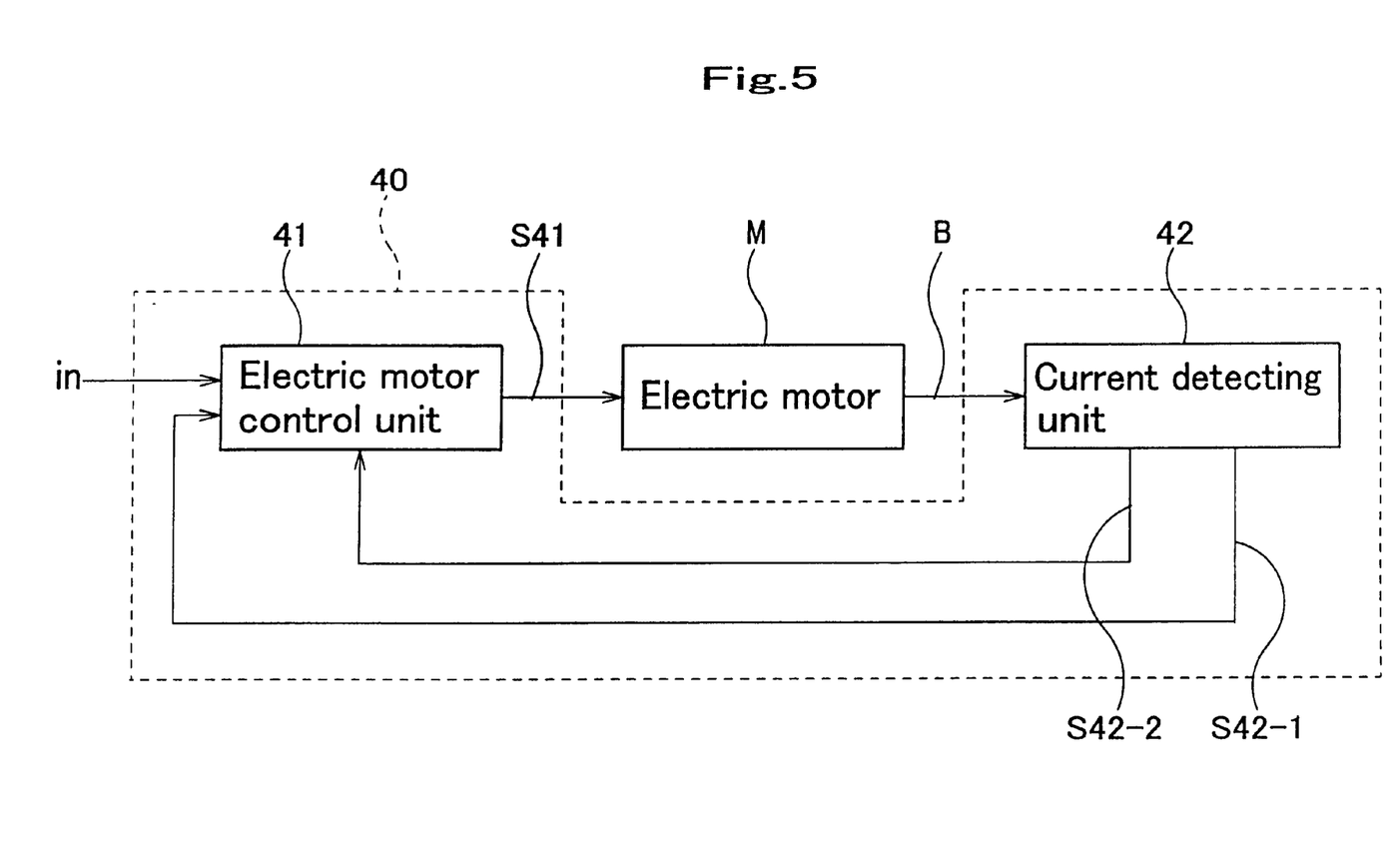
FIG. 5 is a block diagram showing the configuration of an electric motor control apparatus comprising a current detecting apparatus according to one embodiment of the present invention.

FIG. 5 is a block diagram showing the configuration of an electric motor control apparatus comprising a current detecting apparatus according to one embodiment of the present invention.

Reference numeral 40 is an electric motor control apparatus 40 and it comprises an electric motor control means (for example, electric motor control unit) 41. The electric motor control unit 41 has a function that an absolute value of an input signal IN carrying a command of a driving signal S41 for driving an electric motor M is compared with an absolute value of the electric potential of a comparing signal S42-1 and that either a driving signal S41 for decreasing torque corresponding to the positive electric potential difference between the input signal IN and the comparing signal S42-1 or the driving signal S41 for increasing torque corresponding to the negative electric potential difference between the input signal IN and the comparing signal S42-1 is outputted. The electric motor control unit 41 terminates the supply of the driving signal S41 when the terminating signal S42-2 is applied. The electric motor control unit 41 is connected to the electric motor M to be rotated by the driving signal S41 at the output side thereof. Further, the electric motor control apparatus 40 comprises a current detecting means (for example, current detecting unit) 42. The electric detecting unit 42 is a circuit to generate the comparing signal S42-1 which is proportional to the magnetic flux density of the magnetic field B arising from the current IM flowing into the electric motor M and to generate the terminating signal S42-2 when the damage occurs therein. The output of the current detecting unit 42 is connected to the electric motor control unit 41.

Figure 6:
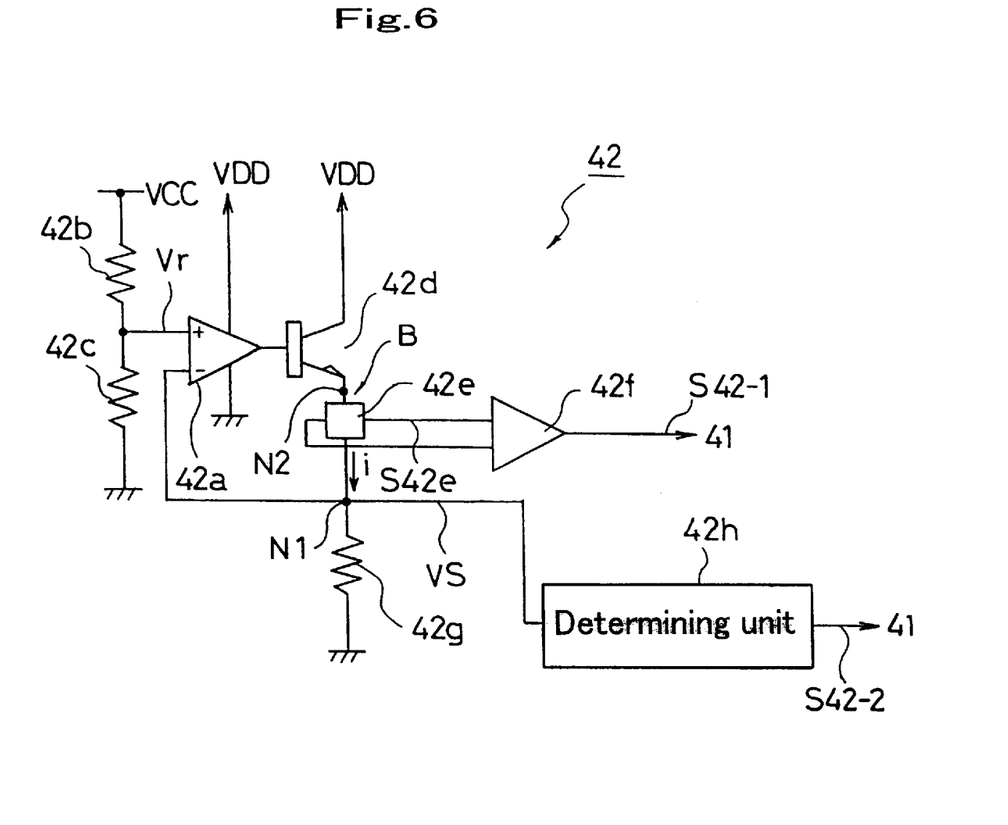
FIG. 6 is a circuit diagram of the current detecting unit 42 of FIG. 5.

FIG. 6 is a circuit diagram showing one embodiment of the current detecting unit 42 of FIG. 5.

The electric detecting unit 42 comprises an op-amp 42a. A noninverting input terminal of the op-amp 42a is connected to a power supply electric potential Vcc through a resistor 42b and grounded through a resistor 42c. An inverting input terminal of the op-amp 42a is connected to a first node N1. A positive power supply terminal of the op-amp 42a is connected to the first power supply electric potential VDD and a negative power supply terminal of the op-amp 42a is grounded. An output terminal of the op amp 42a is connected to a base of a transistor 42d. The power supply electric potential VDD is connected to a collector of the transistor 42d. An emitter of the transistor 42d is connected to a second node N2. The op-amp 42a, the resistors 42b, 42c and the transistor 42d constitute a constant-current regulated power supply.

There is an input terminal of a sensing means (for example, a hall sensor) 42e connected between the node N1 and the node. N2. The magnetic field B-arising from the current IM which is a subject to be detected by the hall sensor and which flows to the electric motor M of FIG. 5—is applied to the hall sensor 42e. In this case, for example, the magnetic field B arises from a ring core having a gap so as to surround wires in which the current IM flows. Then, the hall sensor 42e is provided in the gap. The hall sensor 42e outputs the output signal S42e having the electric potential proportional to a control current i supplied from the node N2 and the magnetic flux density of the magnetic field B.

The output terminal of the hall sensor 42 is connected to an op-amp 42f for amplifying the output signal S42e by a predetermined gain to output the comparing signal S42-1. Further, the node N1 is connected to the second power supply electric potential (for example, ground) through a current setting means (for example, a resistor) 42g. Furthermore, the node N1 is connected to a determining means (for example, determining unit) 42h. The determining unit 42h may comprise a sampling hold circuit for taking the electric potential VS of the node N1 at a predetermined time interval, an A/D converter for analog digital converting the electric potential VS by a predetermined quantizing bit number and outputting a digital value, a digital comparator for determining whether the digital value is in the predetermined range, and a central processing unit for outputting the terminating signal S42-2 if the out of range of the digital value continues longer than the certain period of time.

Next, the operation of the electric motor control apparatus 40 of FIG. 5 will be explained.

The input signal IN is applied to the electric motor control unit 41 and the electric motor control unit 41 outputs the driving signal S41. The electric motor M is driven by the current IM based on the driving signal S41 to rotate, and then the magnetic field B arising from the current IM is applied to the hall sensor 42e of the current detecting unit 42.

In the current detecting unit 42, the electric potential of the node N2 is controlled so that the electric potential VS of the node N1 is equal to the reference electric potential Vr set by the resistors 42b, 42c, and the control current i is supplied to the node N2 from the power supply electric potential VDD. The value of the control current i is set by the resistor 42g. The control current i is supplied to the hall sensor 42e, and the hall sensor 42e outputs the output signal S42e having the electric potential proportional to the control current i and the magnetic flux density of the magnetic field B. The op-amp 42e inputs and amplifies the output signal S42e and outputs the comparing signal S42-1. The electric motor control unit 41 compares the input signal IN with the comparing signal S42-1. Then, if the comparing signal S42-1 is larger than the input signal IN, the electric motor control unit 41 outputs the driving signal S41 for decreasing torque. On the other hand, if the comparing signal S42-1 is smaller than the input signal IN, the electric motor control unit 41 outputs the driving signal S41 for increasing torque.

Figure 7:
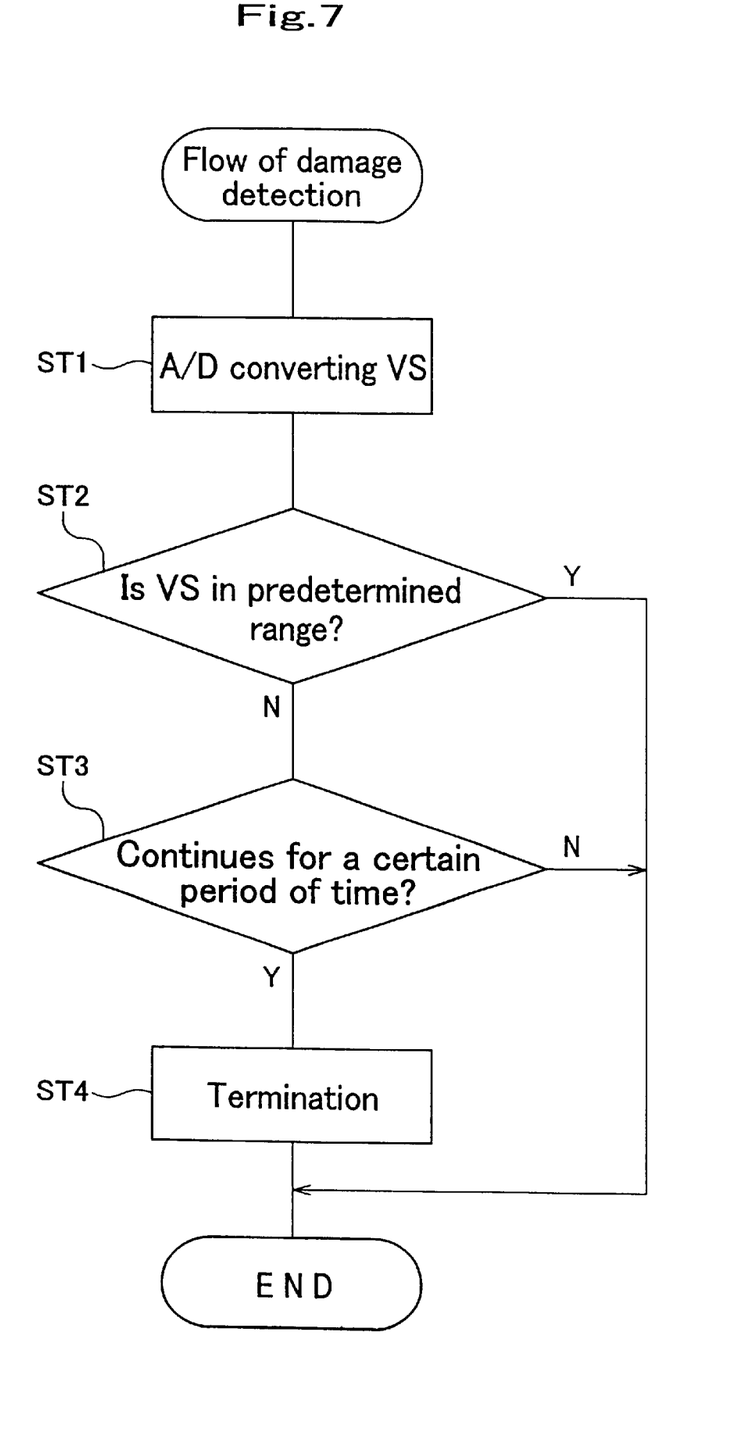
FIG. 7 is a flow chart of FIG. 6.

FIG. 7 is a flow chart showing the operation of the damage determination of the current detecting unit 42 of FIG. 6.

The operation of the damage determination of FIG. 6 will be explained referring to FIG. 7.

The electric potential VS of the node 1 is A/D converted by the determining unit 42h (step ST1), and it is determined whether the digital value is in the predetermined range (step ST2). Further, it is checked whether the condition that electric potential VS is not within the predetermined range continues longer than a certain period of time (step ST3). For example, when the control current i is changed due to the damage of the constituting element such as the op-amp 42a, the transistor 42d and the register 42g, the condition that the electric potential VS is not within the certain range continues longer than a certain period of time. Accordingly, the damage of the constituting element is determined, and the terminating signal S42-2 is transferred to the electric motor control unit 41 (step ST4). Then, the supply of the driving signal S41 from the electric motor control unit 41 is terminated. In the step ST2, in the case that the digital value is within the predetermined range, the terminating signal S42-2 is not transferred. Further, in the step ST3, when the condition that the electric potential VS is not within the predetermined range continues shorter than the certain period of time, the terminating signal S42-2 is not transferred.

As described above, according to the present embodiment, the determining unit 42h of the current detecting unit 42 determines whether the electric potential VS of the node Ni is within the predetermined range and in the case of the condition that the electric potential VS is not within the predetermined range continues longer than the certain period of time, the terminating signal S42-2 is supplied. Accordingly, the damage is of the constituting units can exactly be determined with the simple configuration in a short time. Further, the electric motor control apparatus 40 comprises the current detecting unit 42, so that when the damage occurs inside the current detecting unit 42, it can be stop the operation.

The present invention is not limited to the above-described embodiment but it can be modified in many ways. For example, if the temperature characteristic of the impedance between the input terminals of the hall sensor 42e of FIG. 6 can be ignored, the determining unit 42h may be connected to the node N2, which can also obtain the same operation and effects. Further, one of the registers 42b, 42c of FIG. 6 may be changed to a voltage set element such as a Zener diode. Furthermore, the transistor 42d of FIG. 6 may be changed to a MOSFET. If the op-amp 42a of FIG. 6 is an element that the control current i can be taken, the transistor 42d may be omitted and the output terminal of the op-amp 42a may be connected to the node N2.

According to the current detecting apparatus of the present invention, the control current set by the current setting means is supplied to the sensing means from the current setting means. Then, the sensing means outputs the detecting signal having the electric potential proportional to the magnetic flux density of the magnetic field arising from the current to be detecting and the control current. The determining means determines whether the electric potential of the first node (node N1) or the second node (node N2) is in the predetermined range. When the condition that the electric potential of the first node or the second node is not in the predetermined range continues longer than the predetermined period of time, the determining means outputs the determining signal indicating the damage occurrence of the current detecting apparatus. This is because the determining means determines whether the electric potential of the first node or the second node is in the predetermined range and when the condition that the electric potential is not in the predetermined range continues longer than the predetermined period of time, the determining signal indicating the damage occurrence is outputted.

According to the electric motor control apparatus of the present invention, the absolute value of the input signal applied to the electric motor controlling means is compared with the absolute value of the comparing signal. Then, the electric motor controlling means outputs the driving signal having the level corresponding to the comparison result to the electric motor. The control current set by the current setting means is supplied to the sensing means. Then, the sensing means outputs the comparing signal having the electric potential proportional to the control current and the magnetic flux density of the magnetic field arising from the current flowing to the electric motor. The determining means determines whether the electric potential of the first node or the second node is in the predetermined range. When the condition that the electric potential of the first node or the second node is not in the predetermined range continues longer than the predetermined period of time, the determining means outputs the terminating signal. The terminating signal is applied to the electric motor controlling means and the supply of the driving signal to the electric motor is terminated. According to the electric motor control apparatus of the present invention, the damage of the constituting elements can exactly be determined with the relatively simple configuration in a short time. This is because the determining means of the current detecting means determines whether the electric potential of the first node or the second node is in the predetermined range and when the condition that the electric potential of the first node or the second node is not in the predetermined range continues longer than the predetermined period of time, the determining means outputs the terminating signal. Further, the electric motor control apparatus comprises the current detecting means, so that when the damage occurs inside the current detecting means, it can stop the operation.

While the invention has been described in detail and with reference to specific embodiments thereof, it will be apparent to one skilled in the art that various changes and modifications can be made therein without departing from the spirit and scope thereof.

What is claimed is:

1. A current detecting apparatus comprising:
    a hall element for outputting the change of a current to be detected as a voltage;
    a constant-current regulated power supply for supplying a constant current to said hall element; and
    means for monitoring said constant current, whereby damage of said current detecting apparatus can be detected.

2. A current detecting apparatus according to claim 1, wherein said monitoring means is an output terminal for supplying a voltage which varies according to the change of said constant current.

3. A current detecting apparatus according to claim 1, wherein said monitoring means is an output terminal for supplying a current from which the change of said constant current can be known.

4. A current detecting apparatus according to claim 1 further comprising means for determining the damage of said current detecting apparatus from the change of said constant current monitored by said monitoring means.

5. An electric motor control apparatus comprising:
    an electric motor control unit for controlling power of a motor; and
    a current detecting apparatus comprising a hall element for outputting the change of a current flowing to said motor as a voltage, a constant-current regulated power supply for supplying a constant current to said hall element, and means for monitoring said constant current, whereby the damage of said current detecting apparatus can be detected.

6. An electric motor control apparatus according to claim 5, wherein said monitoring means is an output terminal for supplying a voltage which varies according to said constant current.

7. An electric motor control apparatus according to claim 5, wherein said monitoring means is an output terminal for supplying a current from which the change of said constant current can be known.

8. A current detecting apparatus according to claim 5 further comprising means for determining the damage of said current detecting apparatus from the change of said constant current monitored by said monitoring means.

9. A current detecting apparatus comprising:
    a sensing means connected between a first node and a second node, for generating a detecting signal having electric potential proportional to magnetic flux density of a magnetic field arising from a current to be detected and a control current supplied from said second node;
    a current supplying means for controlling the electric potential of said second node so that the electric potential of said first node is equal to predetermined reference electric potential and supplying said control current from a first power supply electric potential to said second node;
    a current setting means connected between said first node and a second power supply electric potential, for setting said control current to a predetermined value; and
    a determining means for determining whether the electric potential of one of said first node and said second node is in the predetermined range and outputting a determining signal indicating damage occurrence when the condition that the electric potential of one of said first node and said second node is out of the predetermined range continues longer than a predetermined period of time.

10. An electric motor control apparatus comprising:
    an electric motor controlling means for comparing an absolute value of electric potential of an input signal indicating a command of a driving signal for driving an electric motor with an absolute value of electric potential of a comparing signal, generating one of said driving signal for decreasing torque corresponding to the positive electric potential difference between said input signal and said comparing signal and said driving signal for increasing torque corresponding to the negative electric potential difference between said input signal and said comparing signal, supplying said driving signal to said electric motor, terminating the supply of said driving signal when a terminating signal is applied; and a current detecting means for detecting a current of said electric motor and outputting said comparing signal and said terminating signal;

said current detecting means comprising a sensing means connected between a first node and a second node, for generating said comparing signal having electric potential proportional to magnetic flux density of a magnetic field arising from a current of said electric motor;

a current supplying means for controlling the electric potential of said second node so that the electric potential of said first node is equal to predetermined reference electric potential and supplying said control current from a first power supply electric potential to said second node;

a current setting means connected between said first node and a second power supply electric potential, for setting said control current to a predetermined value; and a determining means for determining whether the electric potential of one of said first node and said second node is in the predetermined range and applying said terminating signal to said electric motor controlling means when the condition that the electric potential of one of said first node and said second node is out of the predetermined range continues longer than a predetermined period of time.

11. A current detecting apparatus comprising:

a hall element for outputting the change of a current to be detected as a voltage;

a constant-current regulated power supply for supplying a constant current to said hall element; and a determining unit electrically connected to said constant-current regulated power supply so as to receive said constant current, whereby damage of said current detecting apparatus can be detected.

* * * * *